(12) United States Patent
Fujimori et al.

(10) Patent No.: US 6,538,724 B1
(45) Date of Patent: Mar. 25, 2003

(54) EXPOSURE APPARATUS

(75) Inventors: Nobutaka Fujimori, Fujisawa (JP); Manabu Toguchi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 56 days.

(21) Appl. No.: 09/676,932

(22) Filed: Oct. 2, 2000

(30) Foreign Application Priority Data

Oct. 6, 1999 (JP) .......................................... 11-286102

(51) Int. Cl.⁷ .......................... G03B 27/42; G03B 27/54
(52) U.S. Cl. .......................................... 355/67; 355/53
(58) Field of Search ............................. 355/53, 55, 67; 356/399, 400, 401; 250/548

(56) References Cited

U.S. PATENT DOCUMENTS

| | | | | |
|---|---|---|---|---|
| RE30,099 E | * | 9/1979 | Hosoe et al. ............ 250/208.3 |
| 4,908,656 A | * | 3/1990 | Suwa et al. .................... 355/53 |
| 4,931,830 A | * | 6/1990 | Suwa et al. .................... 355/53 |
| 5,003,342 A | * | 3/1991 | Nishi .......................... 355/43 |
| 5,486,896 A | | 1/1996 | Hazama et al. |
| 6,097,474 A | * | 8/2000 | McCullough et al. ......... 355/53 |

\* cited by examiner

*Primary Examiner*—Russell Adams
*Assistant Examiner*—Andrew Sever
(74) *Attorney, Agent, or Firm*—Oliff & Berridge, PLC

(57) ABSTRACT

Disclosed is an exposure apparatus designed to expose the pattern of a mask through a projection optical system on a substrate by using an exposure light. This exposure apparatus comprises a line width detector for detecting the pattern line width of the mask, and a control unit for controlling the light exposure of the exposure light based on the detecting result of the line width detector. Thus, exposure is easily carried out on the substrate without any line width differences even if a plurality of masks are used.

19 Claims, 10 Drawing Sheets

FIG. 2B  FIG. 2A
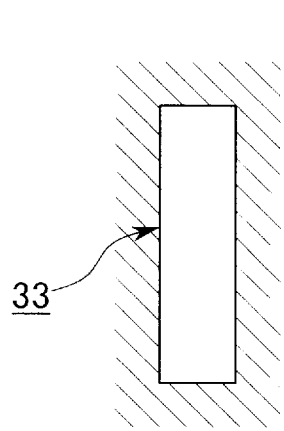
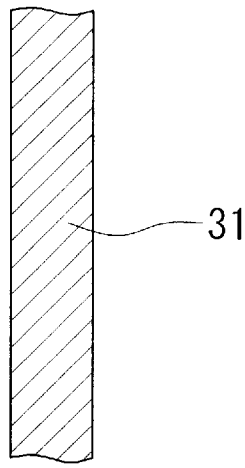
→ SCANNING DIRECTION
FIG. 3
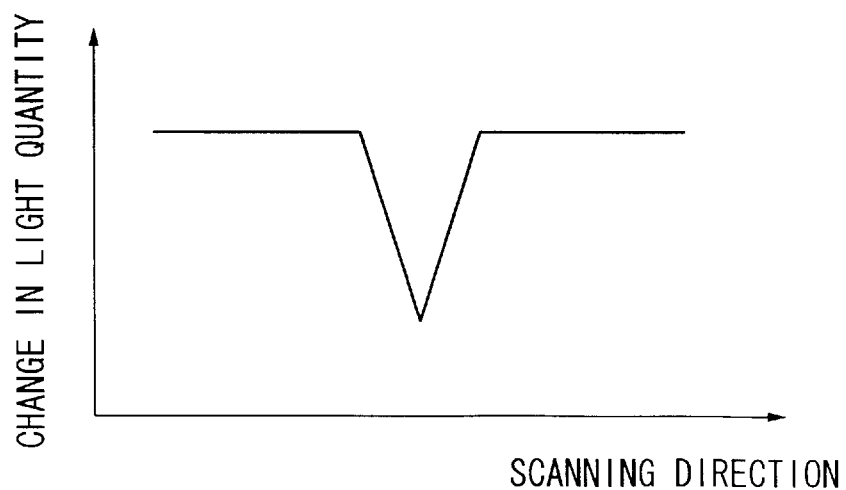
SCANNING DIRECTION

EXPOSURE APPARATUS

BACKGROUND OF THE INVENTION

1. Field of the Invention

The present invention relates to an exposure apparatus for exposing the pattern of a mask on a substrate by using an exposure light. More particularly, the invention relates to an exposure apparatus suitably used for correction of a difference of pattern line widths between masks during picture synthesis carried out using a plurality of masks.

This application is based on Japanese Patent Application No. Hei 11-286102, the contents of which are incorporated herein by reference.

2. Description of the Background Art

As regards a display device for a personal computer, a television set or the like, in recent years, a liquid crystal display substrate which enables a display to make thin, has frequently been used. The liquid crystal display substrate of such a kind is manufactured by using a photolithography method patterning a desired shaped transparent thin-film electrode on a glass plate rectangular in shape viewed from the above. As such a photolithography apparatus, a projection type exposure apparatus is used, which is designed to expose an exposure pattern formed on the mask onto a photoresist layer on the glass plate through a projection optical system.

FIG. 11 shows an example of the exposure apparatus of the above kind. This exposure apparatus denoted by 1 is based on a so-called step and repeat system. According to this system, a pattern formed on a reticle R (e.g., reticle RA) is exposed onto a predetermined region of a glass plate (simply referred to as a plate, hereinafter) 4 held on a stage 3, and then the plate 4 steps by a given distance and the exposure of the reticle R pattern (e.g., reticle RB) is repeated. The pattern on the reticle R, illuminated by an illumination optical system (not shown), is image-formed on the plate 4 held on the stage 3 through a projection optical system 5. The stage 3 is controlled for its position based on accurate monitoring of a position coordinate by laser interferometers 6$a$ and 6$b$ for measuring positions in X and Y directions respectively. Orthogonal coordinate systems X and Y on the stage 3 are used as reference frame for the exposure apparatus 1.

For the purpose of exposing an image of a pattern (geometrical pattern by a light transmitting portion and a light shielding portion) formed on the reticle R onto the plate 4 coated with a resist layer having a specified thickness (1 to 5 $\mu$m), the exposure apparatus 1 comprises an illumination optical system provided to project an exposure light having almost constant intensity with a uniform illuminance distribution from above the reticle R for predetermined time. Alternatively, the exposure apparatus 1 comprises an illumination optical system provided to project a plurality of exposure lights (pulse light) from the pulse emission type laser light source, until its integrated quantity of light reaches a predetermined amount. In either case, to control a line width of the pattern formed on the resist layer with sufficient accuracy, the exposure apparatus 1 is controlled to print the pattern image of the reticle R onto the resist layer with optimal exposure energy, i.e., an optimal energy quantity.

Accordingly, the stage 3 is provided with a sensor (not shown) for measuring the irradiation quantity of an exposure light, which makes it possible to measure the quantity of an illumination light which transmitted from the illumination optical system through the reticle R and the projection optical system 5 and forming an image on the stage 3. The quantity of an illumination light P (mW/cm$^2$) on the stage 3 is measured beforehand, and exposure time t (msec; t=J/P) for exposing the pattern on the reticle R is calculated based on the illumination light quantity P and an optimal exposure energy quantity J (mJ/cm$^2$) decided from the resist and the process. During actual exposure, the exposure time t is adjusted by controlling the illumination optical system (e.g., a shutter). In other words, exposure applied to the plate 4 is controlled by controlling such exposure time. Regarding a focus during exposure, control is performed such that the plate 4 can always be set at the best focus of the projection optical system 5 by using an AF sensor (not shown) to measure the height position of the plate 4 and driving the stage 3 in an optical axial direction.

In addition, in the exposure apparatus 1, in order to find the optimal energy quantity of the exposure light projected to the plate 4, the plate 4 is developed after the execution of test exposure therefor, the line width of a linear pattern is measured by an optical microsope or a dedicated line width measuring device, and then comparison is made with a designed line width value. Alternatively, an optimal exposure condition is decided based on the fact that a line width becomes smallest under a given condition.

For example, if development is carried out after a light width pattern as a part of patterns to be exposed on the reticle R is exposed onto the plate 4 based on the step and repeat system while increasing exposure (exposure time) little by little, a resist image is left according to the pattern on the reticle R. However, because the exposure varies little by little, in the case of a positive resist, as shown in FIG. 12, the line width pattern 7 of the resist image becomes narrow corresponding to the exposure (exposure time). Generally, to plot the change of the line width corresponding to the exposure energy and the focus, a substantially linear change is made like that shown in FIG. 13 if a change in the exposure energy is very small. Thus, based on such a relationship, by reversibly calculating exposure such that gives an optimal line width with respect to a given pattern or process, and performing correction control to expose by this exposure, the line width accuracy of a transferred pattern can be enhanced.

However, the following problems are inherent in the foregoing conventional exposure apparatus.

For example, with the progress in the screen enlargement of the liquid crystal display device, the size of the plate used for the exposure apparatus has been increased more and more. As an exposure method for such a large plate, a so-called picture synthesis method has been used. As shown in FIG. 11, this picture synthesis method uses a plurality of reticles RA to RD respectively corresponding to each of the divided LCD patterns, exposes the pattern of one reticle on the exposure region of the glass substrate corresponding to the reticle, then makes the plate to step and changes the reticle to another, exposes the pattern of the selected reticle on an exposure region corresponding to this reticle, and thus forms an LCD pattern synthesizing a plurality of patterns on the plate.

For example, in the case of exposure on the plate 4 having panels P1 and P2 arranged, panels being made by stitching divided patterns A to D like those shown in FIG. 14, exposure is carried out while changing each of the reticles RA to RD having the divided patterns A to D to another by a reticle replacement mechanism 8, and the large panels P1 and P2 are formed by stitching the divided patterns A to D as shown in FIG. 11.

On the other hand, as it is in recent years, the pattern has been scaled down more with such a screen enlargement, creating the necessity of considering even line width accuracy caused by a reticle manufacturing error. For a layer (a gate layer or a drain/source layer) to be strictly managed practically, optimal light exposure is calculated based on the result of test exposure, and is fed back to exposure control data. Such an operation is carried out to prevent the damaging of device characteristics caused by a level difference, which occurs by presence of a line difference between the stitched portions of the patterns, and a reduction in device quality caused by discontinuous changes in a lamination error at the exposure regions of the respective layers and a pattern line width difference, which occur in the stitched portions of the patterns when picture synthesized divided patterns are laminated to form a multilayer structure.

However, if there are a plurality of reticles constituting a certain layer, as described above, enormous time and labor must be expended to obtain optimal light exposure by carrying out test light exposure for all the reticles. Consequently, a reduction inevitably occurs in production efficiency.

SUMMARY OF THE INVENTION

The present invention was made with the foregoing problems in mind, and it is an object of the invention to provide an exposure apparatus capable of easily performing exposure on a substrate such as a plate or the like without any line width differences between patterns on the substrate even if the exposure on the substrate is executed by using a plurality of reticles (or masks).

In a first aspect of the invention, the exposure apparatus is designed to expose a plurality of patterns stitched together through a projection optical system onto a substrate by an exposure light. The exposure apparatus comprises: a line width detector that detects a pattern line width; and a control unit that controls a light quantity of the exposure light based on a detection result of the line width detector.

In a second aspect of the invention, a photoelectric sensor is used as the line width detector.

In a third aspect of the invention, the photoelectric sensor is a charge coupled device.

In a fourth aspect of the invention, the line width detector comprises: an illumination unit that illuminates a detection light toward the patterns; a light receiving unit that receives the detection light through the patterns and the projection optical system; and a computing unit that computes the pattern line width based on a light quantity of the detection light received by the light receiving unit.

In a fifth aspect of the invention, the detection light obtains the pattern line width based on a change in light quantity intercepted by the patterns when the detection light and the patterns perform a relative movement.

In a sixth aspect of the invention, the pattern line width is obtained based on relative positions of the relative movement and the change in light quantity.

In a seventh aspect of the invention, a direction of the relative movement is a direction approximately perpendicular to the patterns.

In an eighth aspect of the invention, the exposure apparatus further comprises a substrate stage that holds and moves the substrate, wherein the illumination unit is provided in the substrate stage.

In a ninth aspect of the invention, the control unit controls the light exposure based on a difference among the respective pattern line widths when the plurality of patterns are stitched together on the substrate.

In a tenth aspect of the invention, the line width detector detects the pattern line width in the vicinity of stitched portion.

Thus, according to the exposure apparatus of the invention, even if a plurality of masks are used, the pattern line widths can be detected by the line width detector, and the light exposure of the exposure light can be controlled by the control unit to prevent the difference of pattern line widths from the detected line widths when exposure is carried out on the substrate. Hence, even if there is a pattern width difference among the masks, exposure can be carried out on the substrate such that no difference occurs between the line widths printed, without executing test exposure. In addition, when the pattern line widths exposed on the substrate are managed based on absolute values, test exposure is carried out for one mask selected from the plurality of masks, a relative relation is calculated among the pattern line width on the selected mask, the light exposure of the exposure light and the pattern line width printed on the substrate. For the other masks, pattern line widths printed on the substrate can be obtained based on the calculated relative relation and the detected line widths.

BRIEF DESCRIPTION OF THE DRAWINGS

For a more complete understanding of the present invention and the advantages thereof, reference is now made to the following description taken in conjunction with the accompanying drawings.

FIGS. 2A and 2B are plan views respectively showing an alignment mark and a slit mark.

FIG. 3 is a view showing a change in a beam quantity when the slit mark is moved in a relative relation to the alignment mark.

DESCRIPTION OF THE PREFERRED EMBODIMENTS

Figure 1:
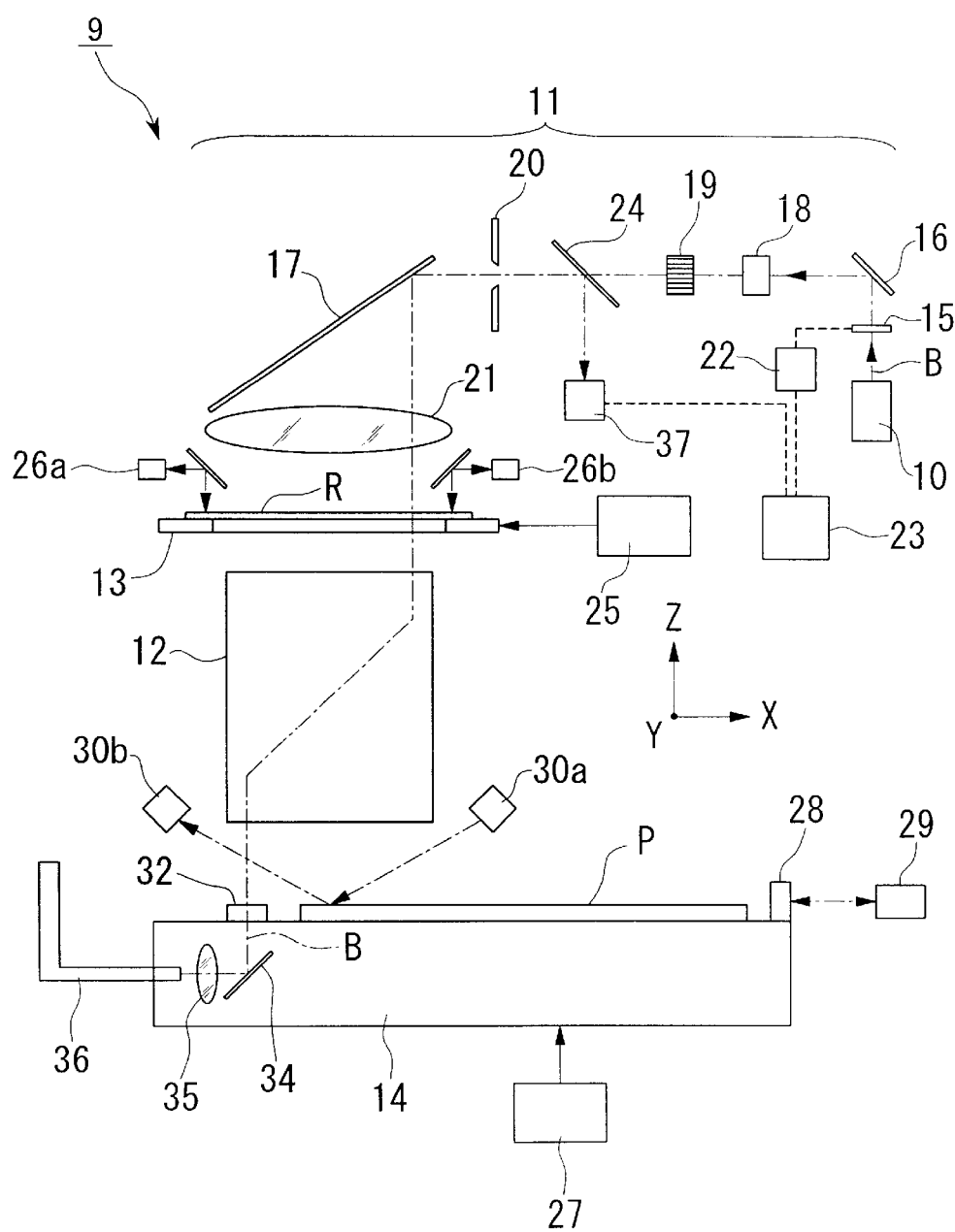
FIG. 1 is a constitutional view schematically showing an exposure apparatus provided with a line width detector according to an embodiment of the present invention.

Next, the preferred embodiment of the invention will be described with reference to FIGS. 1 to 10. The description will be made specifically by taking the example of using an alignment optical system as a line width detector designed for reticle calibration. In the drawings, components like those of a conventional example shown in FIG. 11 are denoted by like reference numerals, and explanation thereof will be omitted.

FIG. 1 schematically illustrates the constitution of an exposure apparatus 9 used for a liquid crystal display device. This exposure apparatus 9 projects and exposes the pattern of a liquid display device formed on a reticle (mask) R onto a plate (substrate) P coated with a photosensitive material (resist), and schematically comprises a light source 10, an illumination optical system 11, a projection optical system 12, a reticle stage (mask stage) 13, and a plate stage (substrate stage) 14. It is assumed herein that Z, X and Y axes are respectively set in the following manner: the Z axis in parallel with the optical axis of the projection optical system 12, the X axis in parallel with a paper surface of FIG. 1 within a surface perpendicular to the optical axis; and the Y axis perpendicular to the paper surface of FIG. 1 within the surface perpendicular to the optical axis.

The light source 10 emits a beam B as an exposure light, and is composed of an extra-high pressure mercury lamp or the like. The beam B emitted from the light source 10 is made incident on the illumination optical system 11.

The illumination optical system 11 includes a shutter 15 for opening/closing the optical path of the beam B, reflecting mirrors 16 and 17, a wavelength selecting filter 18, an optical integrator 19(fly-eye lens or the like) for making the beam B uniform, a variable field stop 20, and a capacitor optical system 21. The shutter 15 is driven via a shutter driving unit 22 to open/close the optical path of the beam B by a control unit 23. In response to the opening operation of the shutter 15, for the beam B made incident on the illumination system 11, a wavelength (g or i line) necessary for exposure is passed through the wavelength selecting filter 18, and illuminance is made uniform by the optical integrator 19. After the illuminance has been made uniform, the beam B is transmitted through a beam splitter 24, and converged in the capacitor optical system 21. Then, the beam B illuminates a region to be illuminated on the reticle R regulated by the opening of the variable field stop 20 in a superposed manner.

The reticle stage 13 holds the reticle R, and is movable two-dimensionally on an XY coordinate system by a reticle stage driving system 25. Above the reticle stage 13, reticle alignment systems 26a and 26b are disposed, that is, photoelectric sensors. The reticle alignment systems 26a and 26b emit alignment lights equal in wavelength to the beam B emitted from the light source 10, and reflected lights thereof are received by a CCD camera (charge coupled device) to perform image processing. As shown in FIG. 2A, an alignment mark 31 formed to be linear on the reticle R by Cr or the like is detected. Based on the result of this detection, the reticle stage 13 is driven by the reticle driving system 25 to align the reticle R in a predetermined position on the XY coordinate system (only an alignment mark extended in one direction is shown, but a similar one is also formed in a direction orthogonal to the alignment mark 31).

The projection optical system 12 forms an image of the pattern present in the region of the reticle R to be illuminated onto the plate P. Then, the photosensitive material coated on the plate P is sensitized to transfer the pattern image onto the plate P.

The plate stage 14 holds the plate P, and is adapted to be movable two-dimensionally on the XY coordinate system by a stage driving device 27. A moving mirror 28 is installed on the plate stage 14. The position of the plate stage 14 (thus, the position of the plate P) is accurately measured based on coherence between a reflected light and an incident light: the reflected light being a result of a laser light emitted from a laser interferometer 29 being reflected on the moving mirror 28, and the incident light being a result of the reflected light being made incident on the laser interferometer 29. The result of measurement by the laser interferometer 29 is outputted to the control unit 23. For the purpose of explanation, in FIG. 1, only the moving mirror 28 and the laser interferometer 29 for measuring the X-direction position of the plate state 14 are shown. Actually, however, another set of a moving mirror and a laser interferometer is provided to measure a Y-direction position.

Oblique incidence type autofocus systems 30a and 30b are provided between the projection optical system 12 and the plate stage 14, and positioning is carried out to always set the surface of the plate P in a specified position in the optical axial direction of the projection optical system 12. In other words, the plate stage 14 is driven in the Z direction such that the exposed surface of the plate P can coincide with the focal surface of the projection optical system 12.

In addition, on the plate stage 14, a disk glass member 32 is arranged in a position roughly coincident with the exposed surface of the plate P with respect to the optical axial direction of the projection optical system 12. As shown in FIG. 2B, the glass member 32 is provided with a slit mark 33 opened in a rectangular shape (only a slit mark extended in one direction is shown, but a similar one is also formed in a direction orthogonal to the slit mark 33).

A mirror 34 and a capacitor lens 35 are disposed below the glass member 32 of the plate stage 14. A beam B transmitted as a detection light by an optical fiber (irradiation unit) 36 is projected from the lower side through the capacitor lens 35 and the mirror 34 to the glass member 32.

An image of the slit mark 33 on the illuminated glass member 32 is reversely projected through the projection optical system 12 onto the reticle R. Then, the beam B transmitted through the reticle R is made incident through the capacitor optical system 21 and the reflecting mirror 17 on the beam splitter 24. The beam B made incident on the beam splitter 24 is then reflected, and made incident on a light quantity sensor (light receiving unit) 37, that is a photoelectric sensor. The light quantity sensor 37 outputs an electric signal to the control unit 23 according to the intensity of the incident beam B. The light quantity sensor 37 is disposed in a surface conjugate with the reticle R.

The control unit 23 executes later-described computing processing in a CPU (computing unit) by using a signal outputted from the light quantity sensor 37. Also, the control unit 23 generally controls the shutter driving unit 22, the reticle driving system 25 and the stage driving device 27. The CPU, the optical fiber 36 and the light quantity sensor 37 constitute the line width detector of the invention.

As regards the detection of the pattern line width of the reticle R carried out by using the exposure apparatus constructed in the foregoing manner, first, a procedure for aligning the reticle R will be described.

When the reticle R is carried onto the reticle stage 13 by a carrier system (not shown), a reticle mark (not shown formed out of the illuminated region on the reticle R is measured by the reticle alignment systems 26a and 26b, and the reticle R itself is aligned by the reticle stage driving system 25.

Then, using the autofocus systems 30a and 30b, the glass member 32 and the plate P are set in positions conjugate with the reticle R with respect to the optical axial direction of the projection optical system 12.

Then, calibration is executed for the reticle R by the alignment system having the optical fiber 36 and the light quantity sensor 37. A method for executing such calibration is described in Patent Laid-Open Nos Sho 63(1988)-5521 and Hei 7 (1995)-321026, which is briefly referenced herein.

When the slit mark 33 is scanned in a measuring direction (direction orthogonal to the longitudinal direction of the mark) with respect to the alignment mark 31 formed near the pattern of the illuminated region on the reticle R, a rectangular beam B passed through the slit mark 33 is intercepted by the alignment mark 31 to change its light quantity, and a signal of a level like that shown in FIG. 3 is outputted from the light quantity sensor 37 corresponding to the coordinate of the slit mark 33 measured by the laser interferometer 29. Then, by obtaining a proper middle point at the slice level of this signal waveform, the coordinate position of the alignment mark 31 in a scanning direction can be obtained.

Then, by measuring the positions of a plurality of alignment marks provided near the pattern based on a procedure similar to the foregoing, the quantity of deviation of each alignment mark from a designed ideal point is calculated. Then, based on the obtained quantity of deviation, the rotational correction quantity of the reticle R, an XY shifting quantity and an XY magnification offset quantity are calculated by a method using a least square method or the like, the reticle R is positioned, and an image-forming characteristic of the projection optical system 12 is adjusted. For such calibration, since measurement is performed in actual transferred positions on the plate P to calculate the quantities of correction, including the pattern error of the reticle R and the distortion of the projection optical system 12, corrections can be made including those for such errors.

Next, a procedure for detecting the pattern line width of the reticle R will be described.

Figure 4:
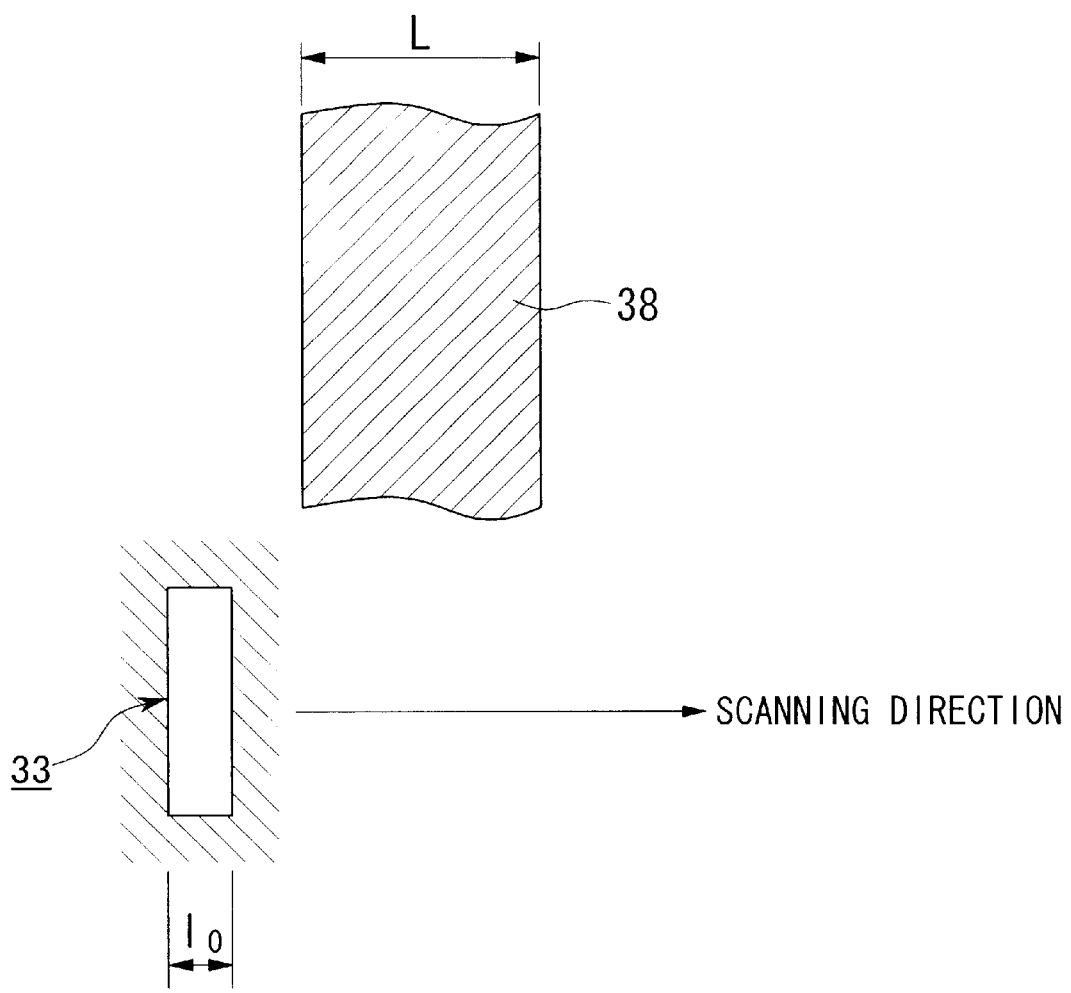
FIG. 4 are plan views respectively showing the slit mark and a line width pattern having a line width larger than the slit mark.

Using the alignment optical system, as shown in FIG. 4, a line width pattern (pattern) 38 on the reticle R, having a line width larger than the slit mark 33 is scanned. Specifically, when the slit mark 33 is scanned (moved in a relative relation) in a direction orthogonal to the line width pattern 38 to cross the same, since the rectangular beam B passed through the slit mark 33 is intercepted by the line width pattern 38, a light quantity detected by the light quantity sensor 37 varies depending on the positions of the slit mark 33 and the line width pattern 38 relative to each other.

Figure 5A:
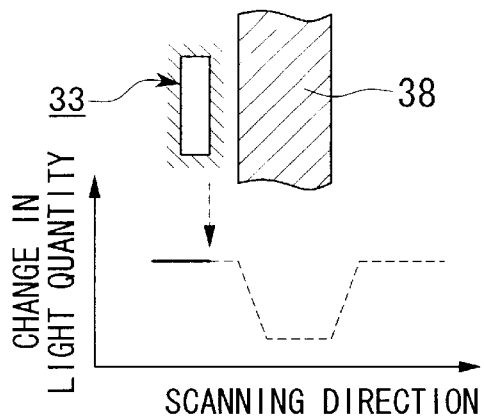
FIGS. 5A to 5E are relational views showing a relation between relative positions of the slit mark and the line width pattern and the light quantity according to the embodiment of the invention.
Figure 5B:
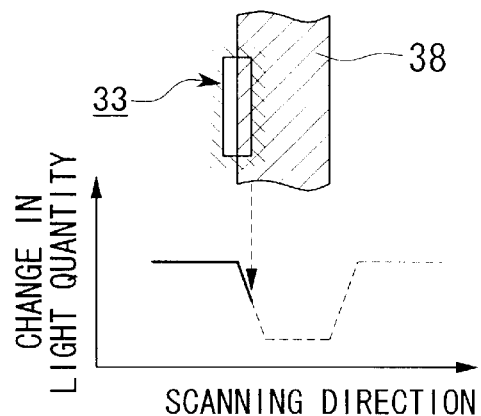

FIGS. 5A to 5E illustrate a positional relation between the slit mark 33 and the line width pattern 38, and a change in light quantity in this case. FIG. 5A shows the state of the slit mark 33 not overlapped with the line width pattern 38. In this case, the light quantity sensor 37 detects a light quantity according to the opening area of the slit mark 33. FIG. 5B shows the state of the slit mark 33 partially overlapped with the line width pattern 38. In this case, the light quantity sensor 37 detects the quantity of the beam B made linearly smaller because of interception by the line width pattern as the slit mark 33 is gradually overlapped with the line width pattern 38.

Figure 5C:
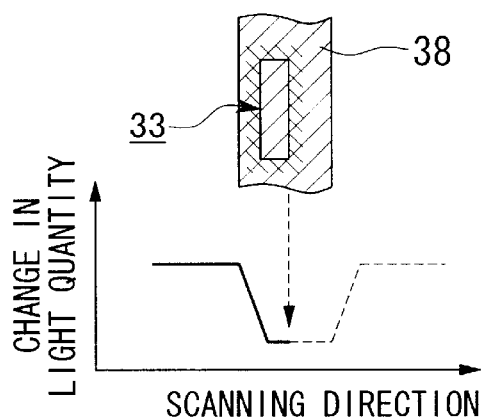
Figure 5D:
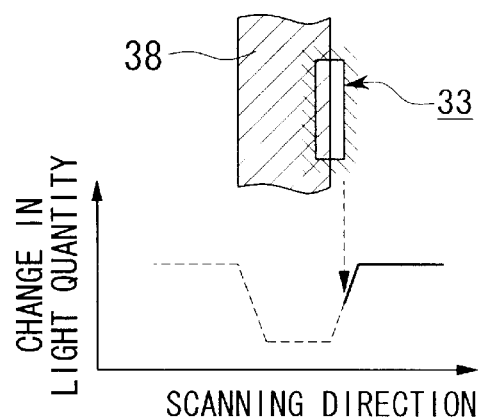
Figure 5E:
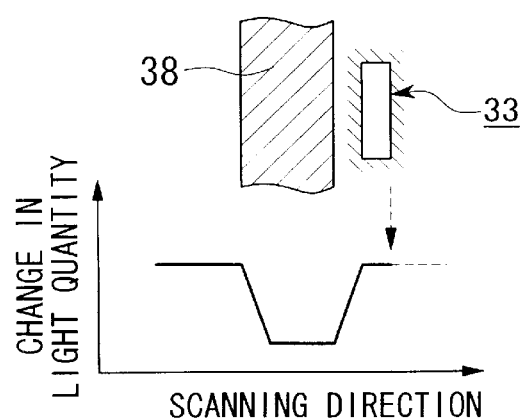

FIG. 5C shows the state of the slit mark 33 completely overlapped with the line width pattern 38. In this case, the quantity of the beam B made incident on the light quantity sensor 37 becomes smallest. FIGS. 5D and 5E respectively show states reverse to those of FIGS. 5B and 5A. By such a series of scanning, a signal waveform like that shown in FIG. 6 is obtained from the light quantity sensor 37 corresponding to the coordinate of the slit mark 33 measured by the laser interferometer 29.

Figure 6:
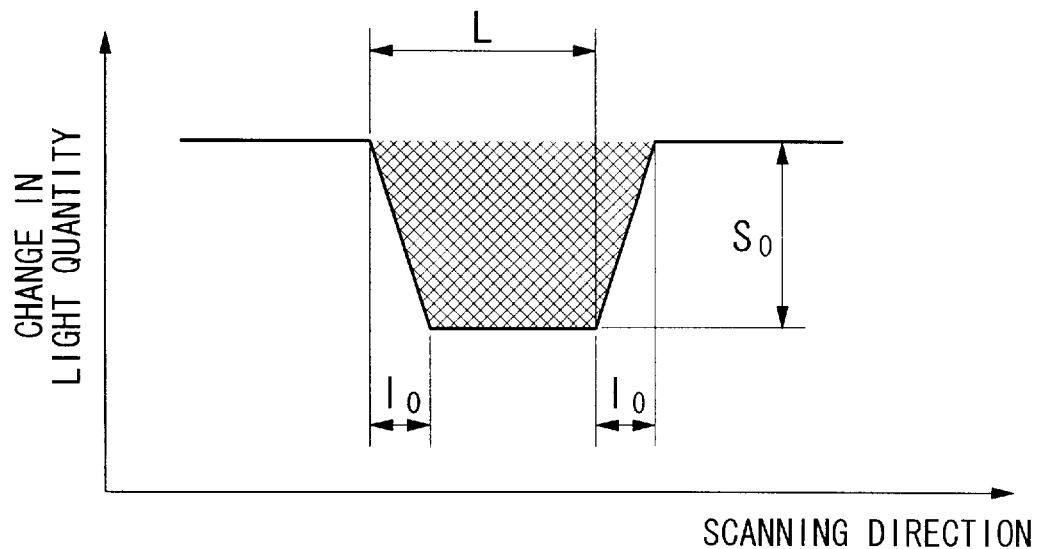
FIG. 6 is a relational view showing a relation between relative positions of the slit mark and the line width pattern and a light quantity.

It is now assumed that a line width of the slit mark 33 on the glass member 32 is $l_0$, a pattern line width to be calculated regarding the line width pattern 38 on the retide R is L, a maximum amplitude of an incident light quantity (difference between the maximum light quantity of FIG. 5A and the minimum light quantity of FIG. 5C) is $S_0$, an area of a trapezoid indicated by the hatched portion of FIG. 6, i.e., an integrated light quantity, is m. Then, the following is established:

$$m=\{(L+l_0)+(L-l_0)\}\times S_0/2=L\times S_0 (L>l_0)$$

hence, $$L=m/S_0 \quad (1)$$

It can therefor be understood that without measuring the line width lo of the slit mark 33, the line width L of the line width pattern 38 can be calculated by measuring the maximum amplitude $S_0$ of the incident light quantity and the integrated light m.

Figure 7:
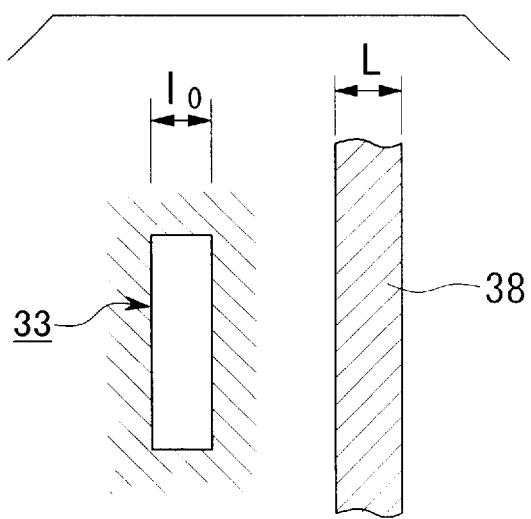
FIG. 7 are plan views respectively showing a slit mark and a line width pattern set at widths equal to each other.
Figure 8:
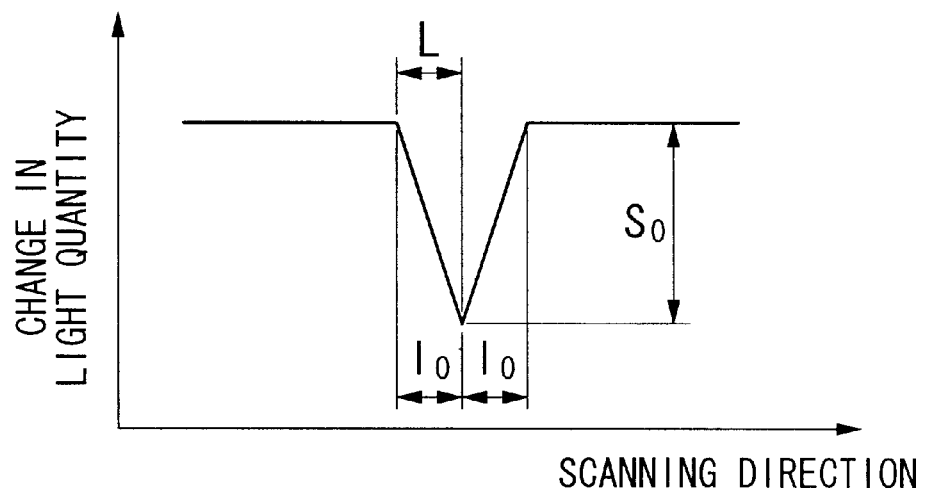
FIG. 8 is a relational view showing a relation between relative positions of the slit mark and the line width pattern shown in FIG. 7 and the light quantity.

The foregoing is limited to the case that the line width pattern 38 on the reticle R is larger than the slit mark 33 (L>$l_0$). However, as shown in FIG. 7, if L=$l_0$ is set, then a signal waveform like that shown in FIG. 8 is obtained from the light quantity sensor 37. In this case, an integrated light quantity m is represented by the following expression:

$$m=(2\times l_0)\times S_0/2=l_0\times S_0=L\times S_0$$

hence, the expression (1) is established.

Figure 9:
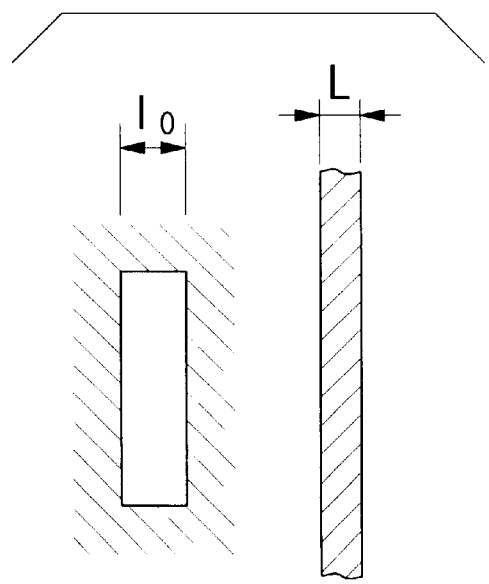
FIG. 9 are plan views respectively showing a slit mark and a line width pattern having a line width smaller than the slit mark.
Figure 10:
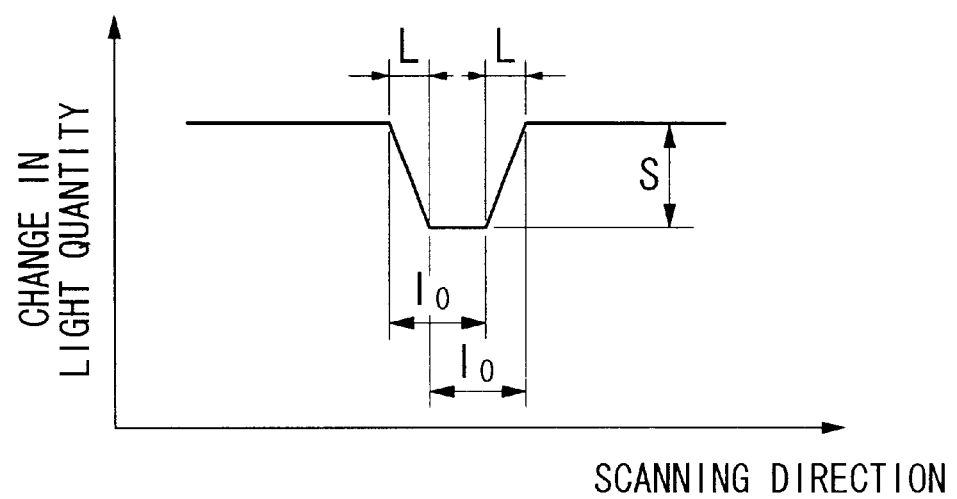
FIG. 10 is a relational view showing a relation between relative positions of the slit mark and the line width pattern shown in FIG. 9 and the light quantity.
Figure 11:
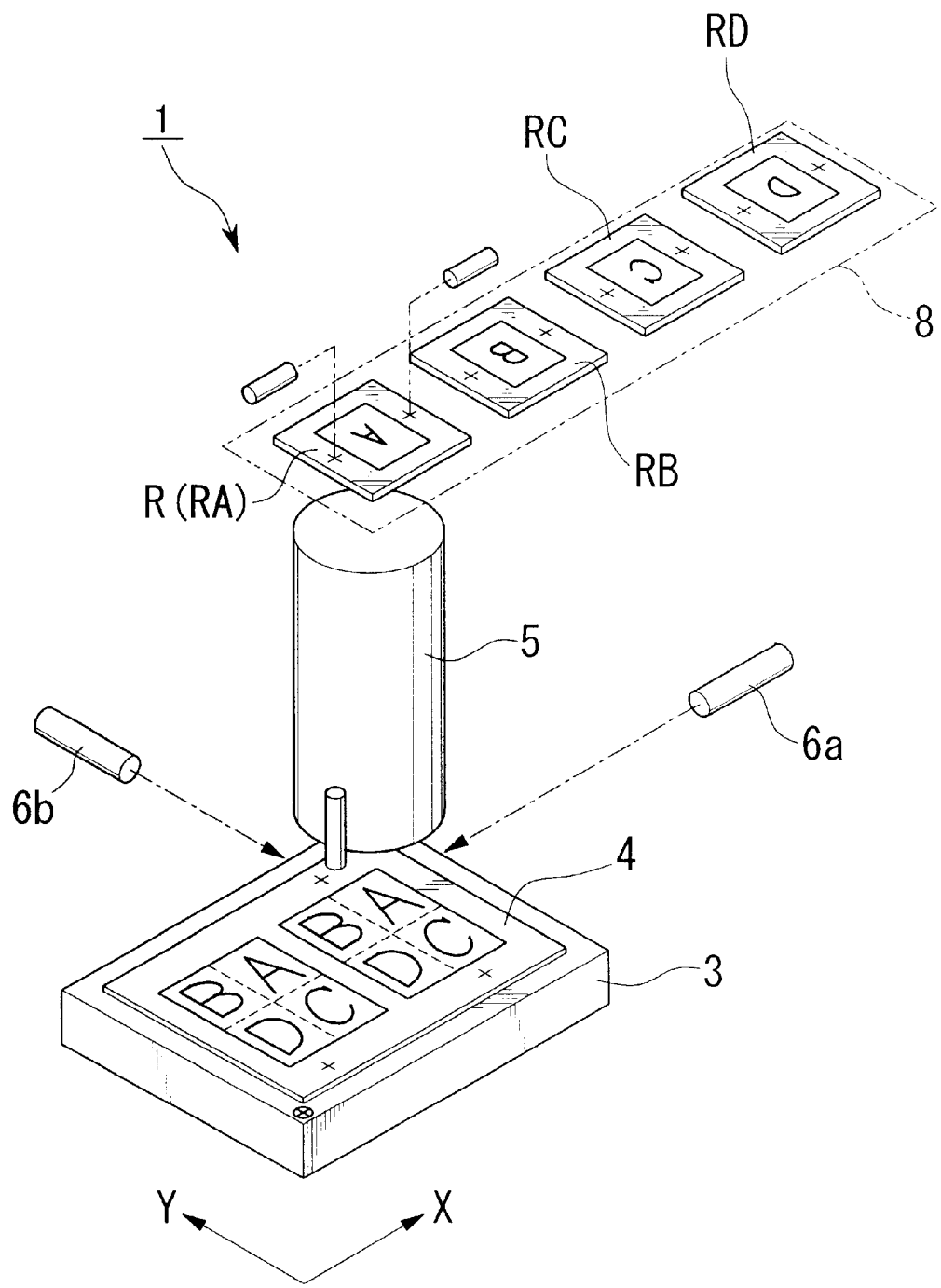
FIG. 11 is a constitutional view schematically showing an example of a conventional exposure apparatus.
Figure 12:
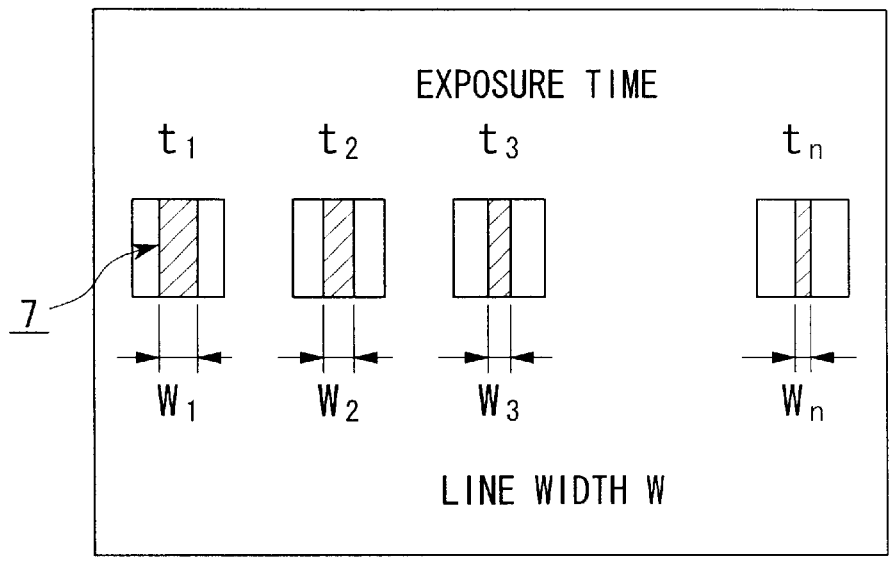
FIG. 12 is a view showing line width patterns exposed in different line widths because of a change in exposure time.

As shown in FIG. 9, if the line width pattern 38 on the retide R is smaller than the slit mark 33 (L<$l_0$, then a signal waveform like that shown in FIG. 10 is obtained from the light quantity sensor 37. In this case, an integrated light quantity m is represented by the following expression:

$$m=\{(l_0+L)+(l_0-L)\}\times S/2=l_0\times S$$

However, if L<$l_0$ is set, since the slit mark 33 is not intercepted completely by the line width pattern 38, a minimum light quantity S is S>$S_0$. As S is directly proportional to the line width L, and a minimum light quantity is set with L=$l_0$, the following is established:

$$S=(L/l_0)\times S_0,$$

and hence $$m=l_0\times S=L\times S_0,$$

hence, the expression (1) is established.

The CPU of the control unit 23 holding the expression (1) computes processing for the signal outputted from the light quantity sensor 37 by using the expression (1), and calculates a pattern line width L on the retide R. When the large panels P1 and P2 shown in FIG. 11 are constructed by using the plurality of reticles RA to RD, pattern line widths L are sequentially calculated for the respective reticles by changing the reticles R.

If picture synthesis is carried out as in the case of the panels P1 and P2, places for measuring pattern line widths on the reticles RA to RD are set near the stitched portions of the patterns. Especially, regarding the reticle for forming a pixel portion by a liquid crystal display device, since the same pattern is transferred to a plurality of exposure regions on one reticle, stitched portions may be present over a plurality of sides. In such a case, for each actual pattern stitched side, a pattern line width near the same is measured.

Figure 13:
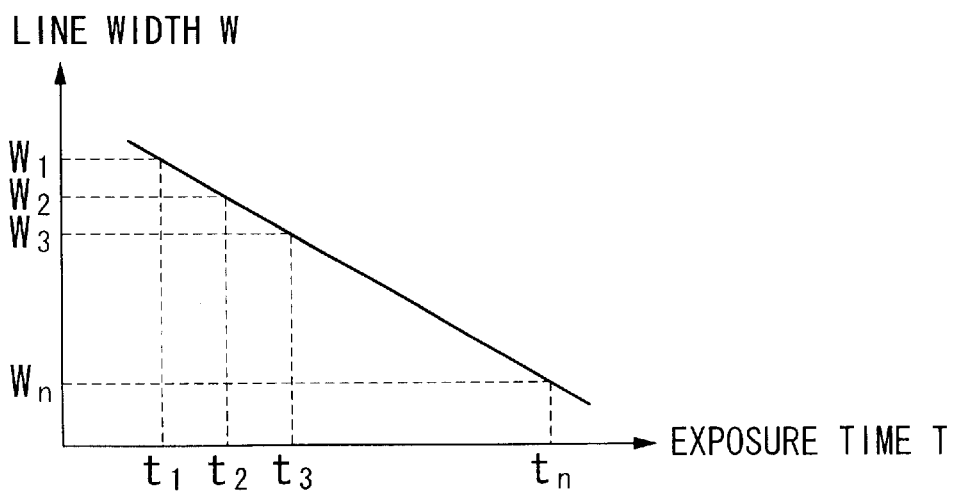
FIG. 13 is a relational view showing a relation between exposure time and line width.
Figure 14:
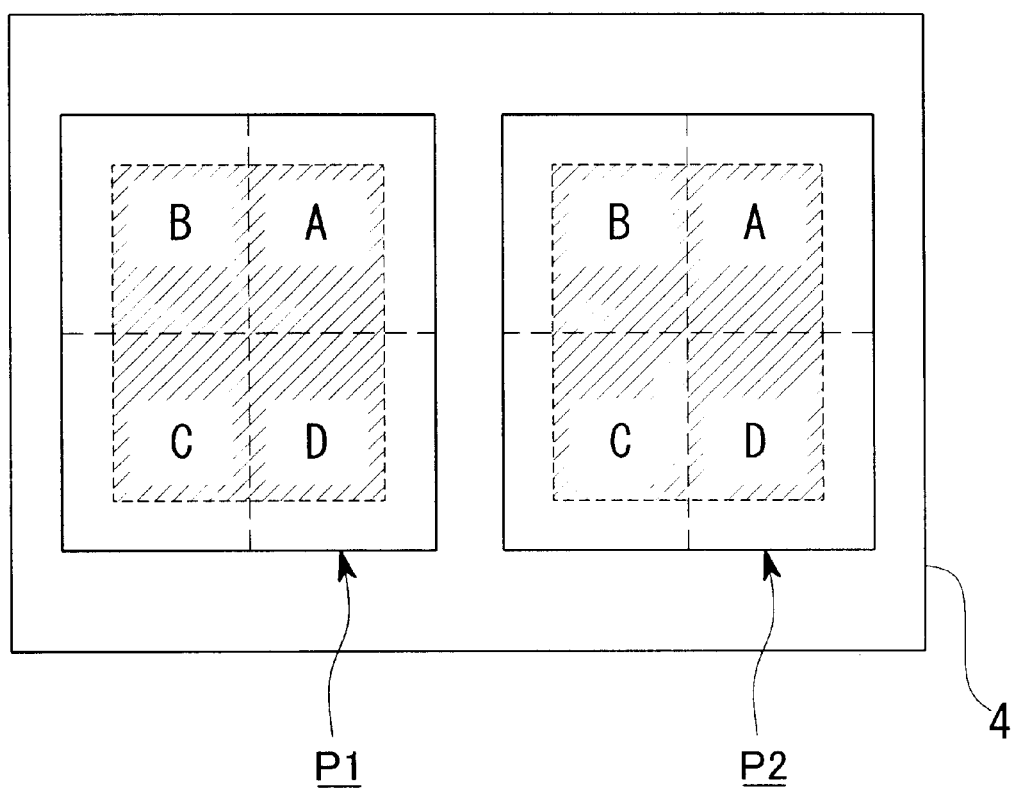
FIG. 14 is a plan view showing a plate provided with panels made by stitching patterns.

Then, when exposure processing is carried out using the reticle, the pattern line width having been measured therefor, as shown in FIG. 13, the control unit 23 controls the shutter driving unit 22 based on a relation between a line width obtained beforehand and exposure time such that a pattern line width difference during exposure on the plate P can be corrected. Accordingly, exposure time by the opening of the shutter 15, i.e., the light exposure of the beam B, is adjusted by a method such as linear interpolation or the like. In this way, it is possible to prevent a line width difference among the patterns in the stitched portions on the plate P.

As picture synthesis, the following two are available and, in any of these methods, the calibration of the line width of the embodiment can be applied.

The first is a method for exposing the peripheral portions of the patterns formed on the reticles RA to RD based on overlapping of a specified amount. The second is a method for synthesizing the patterns formed on the reticles RA to RD based on mechanical accuracy between the reticle stage 13 and the plate stage 14 without any overlapping of the peripheral portions of the patterns formed on the reticles RA to RD.

In the foregoing example, the pattern line width difference present among the patterns among reticles is corrected when exposure is carried out on the plate P. In other words, a relative difference present on the plate P is eliminated. In this case, the plurality of pattern line widths on the reticle may be accurately measured beforehand by SEM or the like, and for this reticle, a light width change made when exposure is carried out by changing exposure time may be measured. Thus, not only the pattern line width difference among the reticles can be corrected but also the pattern line widths actually formed on the plate P can be controlled based on absolute values.

According to the light exposure of the embodiment, since the exposure time, i.e., the exposure energy, of the beam B is controlled based on the pattern line width L of the reticle R detected by the line width detector, even when exposure is executed by using a plurality of reticles, control can be made to prevent the generation of any pattern line width differences on the plate without test exposure, and a reduction in production efficiency can be prevented. Moreover, the line width detector is simply constructed in the manner that the beam B emitted through the optical fiber 36 is received by the light quantity sensor 37, and the CPU of the control unit 23 computes. Specifically, when the beam B and the line width pattern 38 are moved relative to each other, the pattern line width L is calculated based on a change in the quantity of the beam B intercepted by the line width pattern 38. Accordingly, the device can be prevented from being enlarged, and costs can be prevented from being increased, unlike the case of adding a microscope for line width measurement. Since the directions of the relative movements of the beam B and the line width pattern 38 are in a direction roughly orthogonal to the line width pattern 38, i.e., a line width direction, the quantity of the beam B is directly changed with respect to the line width L, making it possible to easily detect the line width L of the line width pattern 38.

In addition, according to the embodiment, since the equipments constituting the line width detector make use of the alignment optical system used for the calibration of the reticle R, pattern line width measurement can be performed without any additional costs.

Furthermore, according to the exposure apparatus of the embodiment, since when the patterns are stitched by using the plurality of reticles RA to RD, the pattern line width L near each stitched portion is detected, and the exposure energy of the beam B is adjusted to correct a line width difference for actual exposure, it is possible to prevent the damaging of the device characteristics, or a reduction in device quality due to the discontinuous change of the picture-synthesized pattern, which otherwise occur if there is a line width difference in the stitched portions on the plate P.

In the embodiment, as means for controlling the light exposure, exposure time is adjusted by using the shutter 15. However, means is not limited to such, and the intensity of the light source 10 may be adjusted. Also, if the exposure apparatus 9 is a scanning type, as means for adjusting light exposure, other than the opening time of the shutter, a method of adjusting a scanning speed during scanning exposure can be selected.

In the embodiment, the line width L of the line width pattern 38 is detected by using a change in the quantity of the beam B when the beam B and the line width pattern 38 are moved relative to each other. However, there should be no limitation placed on this. The line width pattern 38 may be directly imaged by a photoelectric sensor such as a CCD camera or the like, and the line width L may be calculated by using the picked-up image as an index to perform image processing. In such a case, if the line width pattern 38 is imaged by the reticle alignment systems 26a and 26b used for the alignment of the reticle R, and then the line width L of the line width pattern 38 is calculated, the necessity of adding a CCD camera or the like is eliminated, making it possible to prevent the enlargement of the device and cost increases. Further, according to this arrangement, since the necessity of moving the beam B and the line width pattern 38 relative to each other, i.e., the necessity of driving the plate state 14, is eliminated, time for line width detection is shortened, contributing more to the improvement of productivity. In the embodiment, the slit mark 33 is scanned with respect to the line width pattern 38. However, there should be no limitation placed on this. By controlling the reticle stage driving stage 25, the line width pattern 38 may be scanned with respect to the slit mark 33. Also, the pattern of the reticle R may be illuminated with a luminous flux from the light source 10 and, through the projection optical system 12, the line width of the reticle R may be measured by a CCD buried in the plate stage 14. In such a case, since the line width of the reticle R can be measured under the same condition as that during actual exposure, various factors including an image forming error such as the distortion of the projection optical system 12 can be measured, and the line width of the reticle R can be measured with high accuracy.

For the line width of the reticle R, the line width of a pattern to be actually exposed may be measured, or measurement may be carried out by providing a test pattern for line width measurement.

As regards the substrate of the embodiment, other than the plate P for the liquid crystal display device, one may be selected from a semiconductor wafer for a semiconductor device, a ceramic wafer for a thin-film magnetic head, a mask or reticle original plate (synthesized quartz or silicon wafer) used for the exposure apparatus, and so on.

For the exposure apparatus 9, other than the scanning exposure apparatus of a step and scan system (scanning stepper; U.S. Pat. No. 5,473,410) for scaning and exposing the pattern of the reticle R by moving the reticle R and the plate P in synchronization, a projection exposure apparatus of a step and repeat system (stepper) may be employed, which is adapted to expose the pattern of the plate P while the reticle R and the plate P are stationary, and then moving the plate P in sequential steps.

The kind of the exposure apparatus 9 is not limited to the liquid crystal exposure apparatus for exposing the liquid crystal display pattern on the plate P. One may be selected from a wide variety including an exposure apparatus for semiconductor manufacturing, an exposure apparatus for manufacturing a thin-film magnetic head, an image pickup device (CCD) or the reticle R, and so on.

For the light source 10, other than a luminescent line generated from the extra-high pressure mercury lamp (g line (436 nm), h line (404 nm), i line (365 nm)), KrF excimer laser (248 nm), ArF excimer laser (193 nm), and $F_2$ laser (157 nm), charged particles such as X rays, electron beams or the like can be used. For example, as an electron gun when the electron beams are used, lantern hexaborite ($LaB_6$) of a thermionic emission type or tantalum (Ta) can be used. A high frequency such as a YAG laser, a semiconductor laser or the like may also be used.

The magnification of the projection optical system 12 may not only be an equal type, but also reduced or enlarged type. For the projection optical system 12, as a nitrate material, a material transmitting far ultraviolet rays, such as quartz, fluorite or the like, is used when far ultraviolet rays such as an excimer laser are used. When the $F_2$ laser or X rays are used, a cata-dioptric or dioptric optical system may be used (reflection type is also used for the reticle R). When electron beams are used, as an optical system, an electronic optical system composed of an electronic lens and a deflector may be used. Needless to say, an optical path transmitting electron beams should be set in a vacuum state. In addition, without using the projection optical system 12, a proximity exposure apparatus can be employed, which is designed to the pattern of the reticle R by putting the reticle R and the plate P very close to each other.

If a linear motor (U.S. Pat. Nos. 5,623,853 or 5,528,118) is used for the plate stage 14 or the reticle stage 13, any one of an air floating type using an air bearing and a magnetic floating type using Lorentis force or a reactance force can be used.

The stages 13 and 14 may be types moved along guides, or guide-less types having no guides provided.

For the driving mechanism of the stages 13 and 14, a plane motor may be used, which includes a magnet unit having a magnet two-dimensionally arranged and an armature unit having a coil two-dimensionally arranged, these units being place to face each other, and drives the stages 13 and 14 by an electromagnetic force. In such a case, either one of the magnet unit and the armature unit is connected to the stages 13 and 14, and the other of the magnet unit and the armature unit is provided in the moving surface side of the stages 13 and 14.

A reactive force generated by the movement of the plate stage 14 may be mechanically relieved to the floor (ground) by using a frame member, as described in Patent Laid-Open Hei 8 (1996)-166475 (U.S. Pat. No. 5,528,118).

A reactive force generated by the reticle stage 13 may be mechanically relieved to the floor (ground) by using a frame member, as described in Patent Laid-Open Hei 8 (1996)-330224 (U.S. Ser. No. 08/416,558).

The exposure apparatus 9 of the invention can be manufactured by incorporating the illumination optical system 11 and the projection optical system 12 respectively composed of pluralities of optical devices in the main body of exposure apparatus to carry out optical adjustment, attaching the reticle stage 13 and the plate stage 14 respectively composed of a number of mechanical components, connecting wires and pipes thereto, and then carrying out overall adjustment (electrical adjustment, operation verification, and so on). The exposure apparatus 9 should preferably be manufactured in a dean room, a temperature, the degree of cleanliness, and so on of which are managed.

The device such as a liquid crystal device, a semiconductor device or the like is manufactured in the process including the step of designing the function/performance of each device; the step of manufacturing the reticle R based on the designing step; the step of manufacturing the plate P, the wafer or the like; the step of exposing the pattern of the reticle R on the plate P or the wafer by the exposure apparatus 9 of the embodiment; the step of assembling each device (in the case of the wafer, including dicing, bonding and packaging steps); the step of performing inspection; and others.

Although the preferred embodiments of the present invention have been described in detail, it should be understood that various changes, substitutions and alternations can be made therein without departing from spirit and scope of the inventions as defined by the appended claims.

As apparent from the foregoing, the exposure apparatus in the first aspect of the invention is adapted to detect the pattern line width of a mask by the line width detector, and control the light exposure of an exposure light by the control unit based on the result of this detection.

Thus, in the exposure apparatus, even if exposure is carried out by using a plurality of masks, since control can be made to prevent the generation of any differences of pattern line widths on the substrate, a reduction in production efficiency can be prevented without any need to carry out test exposure.

The exposure apparatus in the second aspect of the invention is adapted to use the photoelctric sensor as the line width detector.

Thus, in the exposure apparatus, it is possible to prevent the enlargement of the device and cost increases, different from the case where the microscope is added for line width measurement.

The exposure apparatus in the third aspect of the invention is adapted to include the photoelectric sensor as a charge coupled device.

Thus, in the exposure apparatus, it is possible to prevent the enlargement of the device and cost increases, different from the case where the microscope is added for line width measurement. In addition, if the alignment system for aligning the masks has a charge coupled device, by using this alignment system, further miniaturization and more cost reduction can be realized. Further, since the necessity of driving the substrate stage is eliminated, time for line width detection is shortened, contributing more to the increase of productivity.

The exposure apparatus in the fourth aspect of the present invention is adapted to comprise the line width detector, which includes the illumination unit for projecting a detection light, the light receiving unit for receiving the pattern and the detection light through the projection optical system, and the computing unit for operating the pattern line width based on the quantity of the light received by the light receiving unit.

Thus, in the exposure apparatus, since the pattern line width is calculated by the simple structure, the enlargement of the device and cost increases can be prevented, different from the case where the microscope is added for line width measurement.

The exposure apparatus in the fifth aspect of the invention is adapted to calculate the pattern line width based on the change in light quantity intercepted by a detection light, when the detection light and the pattern are moved relative to each other.

Thus, in the exposure apparatus, the pattern line width can be easily calculated by the simple operation of detecting the change in the quantity of the detection light.

The exposure apparatus in the sixth aspect of the invention is adapted to calculate the pattern line width based on the relative positions of relative movements and the change in light quantity.

Thus, in the exposure apparatus, the pattern line width can be easily calculated by the simple operation of detecting the relative positions of relative movements and the change in the quantity of the detection light.

The exposure apparatus in the seventh aspect of the invention employs the method of setting the directions of relative movements to be roughly orthogonal to the pattern.

Thus, in the exposure apparatus, the quantity of the detection light is directly changed with respect to the pattern line width, and the line width of the line width pattern can be easily detected.

The exposure apparatus in the eighth aspect of the invention comprses the illumination unit provided in the substrate stage.

Thus, in the exposure apparatus, the relative positions of relative movements can be detected by the substrate stage constituting a reference coordinate system during exposure, and the pattern line width can be detected with high accuracy. In addition, if the alignment system used for mask calibration is used as the line width detector, a cost reduction can be made without any additional costs.

The exposure apparatus in the ninth aspect of the invention of the invention is adapted to control light exposure based on a difference among the pattern line widths when the plurality of patterns are stitched together on the substrate.

Thus, in the exposure apparatus, it is possible to prevent the damaging of device characteristics or a reduction in device quality due to the discontinuous change of the picture-synthesized pattern, which otherwise occur if there is a line width difference in the stitched potions on the substrate.

The exposure apparatus in the tenth aspect of the invention is adapted to detect the pattern line width near the stitched portion by the line width detector.

Thus, in the exposure apparatus, the line width in the stitched portion on the substrate can be corrected, and it is therefore possible to prevent the damaging of device characteristics, or a reduction in device quality due to the discontinuous change of the picture-synthesized pattern.

What is claimed is:

1. An exposure apparatus that exposes a plurality of patterns stitched together through a projection optical system onto a substrate by an exposure light, said exposure apparatus comprising:
   a line width detector that detects pattern line widths of a plurality of said patterns in the vicinity of a portion where the patterns are to be stitched, before light exposure; and
   a control unit that controls a light quantity of said exposure light based on a detection result of the line width detector to set the pattern line widths of a plurality of said patterns stitched together onto said substrate to a predetermined width to correct a pattern line width difference on the substrate to be exposed, using a relation between exposure time and pattern line widths which were obtained beforehand.

2. The exposure apparatus according to claim 1, wherein a photoelectric sensor is used as said line width detector.

3. The exposure apparatus according to claim 2, wherein said photoelectric sensor is a charge coupled device.

4. The exposure apparatus according to claim 1, wherein said line width detector comprises:
   an illumination unit that illuminates a detection light toward said patterns;
   a light receiving unit that receives said detection light through said patterns and said projection optical system; and
   a computing unit that computes said pattern line width based on a light quantity of the detection light received by the light receiving unit.

5. The exposure apparatus according to claim 4, wherein said detection light obtains said pattern line width based on a change in light quantity intercepted by said patterns when said detection light and said patterns perform a relative movement.

6. The exposure apparatus according to claim 5, wherein said pattern line width is obtained based on relative positions of said relative movement and said change in light quantity.

7. The exposure apparatus according to claim 5, wherein a direction of said relative movement is a direction perpendicular to a direction in which said patterns extend, to measure the pattern line widths with the detection light.

8. The exposure apparatus according to claim 4, further comprising a substrate stage that holds and moves said substrate, wherein said illumination unit is provided in said substrate stage.

9. The exposure apparatus according to claim 1, wherein said control unit controls said light exposure, to correct a difference of said pattern line widths, based on a difference among the respective pattern line widths when said plurality of patterns are stitched together on said substrate.

10. The exposure apparatus according to claim 9, wherein said line width detector detects the pattern line width in the vicinity of a stitched portion of each of said patterns.

11. The exposure apparatus according to claim 1, wherein:
   a plurality of said patterns are provided on a plurality of different masks; and
   said line width detector detects pattern line widths of patterns provided on said masks.

12. The exposure apparatus according to claim 11, wherein:
   said control unit controls light quantities of said exposure light for respective masks.

13. The exposure apparatus according to claim 1, wherein:
   said line width detector detects pattern line widths of a plurality of said patterns using said projection optical system.

14. An exposure method that exposes a plurality of patterns stitched together through a projection optical system onto a substrate by an exposure light, said method comprising:
   detection step of detecting pattern line widths of a plurality of said patterns in the vicinity of a portion where the patterns are to be stitched, before light exposure;

determination step of determining a light quantity of said exposure light based on a detection result of a line width detector to set the pattern line widths of a plurality of said patterns stitched together onto said substrate to a predetermined width to correct a pattern line width difference on the substrate to be exposed, using a relation between exposure time and pattern line widths which were obtained beforehand; and exposure step of controlling a quantity of exposure light to a light quantity determined in the determination step, and of exposing said patterns onto said substrate.

15. The exposure method according to claim 14, wherein said detection step detects the pattern line widths with a pattern error of patterns and an image forming characteristic of said projection optical system.

16. The exposure method according to claim 14, wherein said detection step detects the pattern line widths by measuring an image of said pattern using said projection optical system.

17. The exposure method according to claim 14, wherein said detection step obtains said pattern line width based on a change in light quantity intercepted by said patterns when said detection light and said patterns perform a relative movement.

18. The exposure method according to claim 14, wherein said determination step determines a light quantity of said exposure light, to correct a difference of said pattern line widths, based on a difference among the respective pattern line widths when said plurality of patterns are stitched together on said substrate.

19. The exposure method according to claim 14, wherein said exposure step moves said patterns and said substrate in synchronization with respect to said exposure light, and controls a light quantity of said exposure light by adjusting a scanning speed of synchronous scanning.

* * * * *